US008112145B2

(12) United States Patent
Grist et al.

(10) Patent No.: US 8,112,145 B2
(45) Date of Patent: Feb. 7, 2012

(54) MRI METHOD FOR ASSESSING MYOCARDIAL VIABILITY

(75) Inventors: Thomas M. Grist, Madison, WI (US); Orhan Unal, Fitchburg, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1612 days.

(21) Appl. No.: 10/860,210

(22) Filed: Jun. 3, 2004

(65) Prior Publication Data

US 2005/0272997 A1 Dec. 8, 2005

(51) Int. Cl.
*A61B 5/05* (2006.01)
(52) U.S. Cl. ........ 600/413; 600/407; 600/410; 600/420; 600/431; 324/309
(58) Field of Classification Search .................. 600/410, 600/413, 420, 431, 407; 324/309
See application file for complete search history.

(56) References Cited

U.S. PATENT DOCUMENTS

| | | | | |
|---|---|---|---|---|
| 5,000,182 A * | 3/1991 | Hinks | ............................ | 600/413 |
| 5,492,124 A * | 2/1996 | Purdy | ............................ | 600/413 |
| 5,999,839 A * | 12/1999 | Hardy et al. | .................. | 600/413 |
| 6,070,097 A * | 5/2000 | Kreger et al. | .................. | 600/521 |
| 6,078,175 A * | 6/2000 | Foo | ................................ | 324/306 |
| 6,188,922 B1 * | 2/2001 | Mistretta et al. | .............. | 600/419 |
| 6,195,579 B1 * | 2/2001 | Carroll et al. | .................. | 600/420 |
| 6,205,349 B1 | 3/2001 | Kim et al. | | |
| 6,487,435 B2 * | 11/2002 | Mistretta et al. | .............. | 600/420 |
| 6,526,307 B2 | 2/2003 | Foo | | |
| 6,662,037 B2 * | 12/2003 | Foo | ............................... | 600/413 |
| 6,937,883 B2 * | 8/2005 | Prince | ........................... | 600/411 |
| 6,954,067 B2 * | 10/2005 | Mistretta | ....................... | 324/307 |
| 6,961,607 B2 * | 11/2005 | Uzgiris | ......................... | 600/420 |
| 2003/0060698 A1 * | 3/2003 | Mistretta | ....................... | 600/410 |
| 2003/0135103 A1 * | 7/2003 | Mistretta | ....................... | 600/410 |
| 2005/0245812 A1 * | 11/2005 | Kim et al. | ...................... | 600/410 |

* cited by examiner

*Primary Examiner* — Brian Casler
*Assistant Examiner* — Joel Lamprecht
(74) *Attorney, Agent, or Firm* — Quarles & Brady LLP

(57) ABSTRACT

An assessment of myocardial viability in a subject is performed by acquiring an MR image which distinguishes infarcted myocardium from normal myocardium. A contrast agent is used and after a waiting period, a cardiac-gated segmented inversion recovery gradient-recalled radial sampling technique is employed to acquire NMR data over a substantial portion of the cardiac cycle. By interleaving the radial sampling patterns, images can be reconstructed over a range of possible TI intervals enabling the optimal TI for maximum contrast to be retrospectively selected.

10 Claims, 5 Drawing Sheets

MRI METHOD FOR ASSESSING MYOCARDIAL VIABILITY

STATEMENT REGARDING FEDERALLY SPONSORED RESEARCH

This invention was made with government support under Grant No. 1R01HL67029-01 awarded by the National Institute of Health. The United States Government has certain rights in this invention.

BACKGROUND OF THE INVENTION

The field of the invention is nuclear magnetic resonance imaging ("MRI") methods and systems. More particularly, the invention relates to producing magnetic resonance images that enable assessment of the myocardial viability in patients with coronary artery disease.

When a physician has diagnosed a patient as having ischemic heart disease, it is important to know whether the myocardium is injured or infarcted, and where. Once the existence and extent of injury and/or infarction has been determined, the physician can decide whether to treat the patient with drugs or whether to carry out a surgical intervention.

Physicians often use myocardial radionuclide studies to help make this determination. A myocardial radionuclide study is a technique whereby the patient's blood is radiolabelled using a radioisotope of a type that is taken up by myocardial tissue (e.g. Thallium). The patient's heart is then imaged using a scintillation camera in a nuclear medicine or positron emission tomography ("PET") study. If a particular region of the myocardium takes up the radioisotope, that region is assumed to contain living tissue; if not, the region is assumed to contain infarcted tissue. However, because both perfusion and viability are necessary for uptake, it may be difficult to distinguish the relative contributions that ischemia and infarction make to the defect.

Nuclear medicine studies also have very poor spatial resolution. As a result, such studies do not precisely show where tissue is dead, where tissue is injured, and where tissue is normal. Furthermore, nuclear medicine studies may take a long time (a conventional multi-scan myocardial radionuclide study may require five hours or more including the time between scans). MRI studies, on the other hand, have excellent spatial resolution and can be completed in less than one hour.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The prevailing methods used to acquire NMR signals and reconstruct images use a variant of the well known Fourier transform (FT) imaging technique, which is frequently referred to as "spin-warp". The spin-warp technique is discussed in an article entitled "Spin-Warp NMR Imaging and Applications To Human Whole-body Imaging" by W. A. Edelstein et al., *Physics in Medicine and Biology*, Vol. 25, pp. 751-756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one Cartesian coordinate system direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of "views" that are acquired during the scan to produce a set of NMR data from which an entire image can be reconstructed.

To increase the rate at which image frames are acquired, image quality may be sacrificed by acquiring fewer phase encoding views, or by using faster pulse sequences that inherently result in lower quality images. With the spin-warp methods, therefore, there is a trade-off between the number of views that are acquired to achieve the desired image resolution and quality, and the rate at which NMR data for a complete image may be acquired.

More recently, an alternative method of acquiring NMR image data has been used in which no phase encoding gradients are employed. Instead, only a readout gradient is applied during the acquisition of each NMR signal (i.e., "view") and a series of different views are acquired by rotating the angle of the readout gradient. Rather than sampling k-space in a rectilinear scan pattern as is done in Fourier imaging and shown in FIG. 2, this "projection reconstruction" method samples k-space with a series of views that sample radial lines extending outward from the center of k-space as shown in FIG. 3. The number of views needed to sample k-space determines the length of the scan and if an insufficient number of views are acquired, streak artifacts are produced in the reconstructed image.

Because the beating heart is constantly moving, the many different views needed to reconstruct an artifact-free image are acquired over a series of heart beats at approximately the same point in the cardiac cycle. Image acquisition is gated using an ECG trigger signal, and typically four to eight views (referred to as a "segment") are acquired at a selected time interval after the cardiac trigger signal. The reconstructed image depicts the heart at a particular moment, or cardiac phase, in its cycle as determined by the selected delay time.

To assess myocardial viability, a number of measures can be taken to enhance the image contrast between infarcted myocardium and normal myocardium. First, a contrast agent is injected prior to image acquisition and an inversion RF pulse followed by a recovery time (TI) is performed before the acquisition of the NMR data segment. This is shown in FIG. 4, where an RF inversion pulse 10 is produced after each ECG trigger signal 12 and an NMR data segment 14 is acquired at a time interval TI thereafter by the performance of four to eight phase encodings or views 16. The contrast agent shortens the $T_1$ relaxation value of infarcted myocardium, and as a result, the longitudinal magnetization $M_z$ of spins in the infarcted region recovers quickly from the inversion pulse 10 as indicated by line 18. The $T_1$ relaxation value of normal myocardium, however, is not shortened and the longitudinal magnetization $M_z$ of normal tissue recovers from the inversion pulse 10 more slowly as indicated by curve 20. If the delay time TI is set properly, the longitudinal magnetization $M_z$ of normal myocardium is substantially zero when the segment of NMR data 14 is acquired with the result that very little, if any NMR signals are produced by normal myocardium spins. The normal myocardium is thus suppressed in the reconstructed image. Infarcted myocardium, however, appears brightly in the image because the longitudinal magnetization 18 has recovered to a substantial amount by the time TI following the inversion pulse 10.

This contrast mechanism works well if the delay period TI is properly set. Even a few milliseconds error from the optimal TI setting shown in FIG. 4 substantially reduces the contrast between normal and infarcted myocardium in the final image. Prospectively setting the TI delay accurately is difficult because the TI delay period required to null the NMR signals from normal myocardium varies from patient to patient, and it varies as a function of the contrast agent dosage. As a result, approximately 80% of the scans must be repeated with a different TI in order to obtain a clinically acceptable image.

SUMMARY OF THE INVENTION

The present invention is a method for performing an inversion recovery MRI pulse sequence in which the time delay TI following application of an inversion RF pulse is established retrospectively. More specifically, MRI data is acquired by repeating a pulse sequence in which MRI data is acquired continuously for an interval of time following application of an inversion RF pulse by acquiring a series of projections to sample different trajectories in k-space. At the completion of the scan an image is reconstructed by selecting a k-space data set from acquired MRI data based on a retrospectively selected delay time TI.

A general object of the invention is to enable the TI delay period of a cardiac gated, inversion recovery MRI data acquisition to be retrospectively set. By acquiring interleaved projections using a projection reconstruction pulse sequence over a time span following each inversion RF pulse, k-space image data sets can be formed by retrospectively selecting projections acquired at different delay times TI. The delay time which provides the optimal image contrast can thus be determined after the scan is performed.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
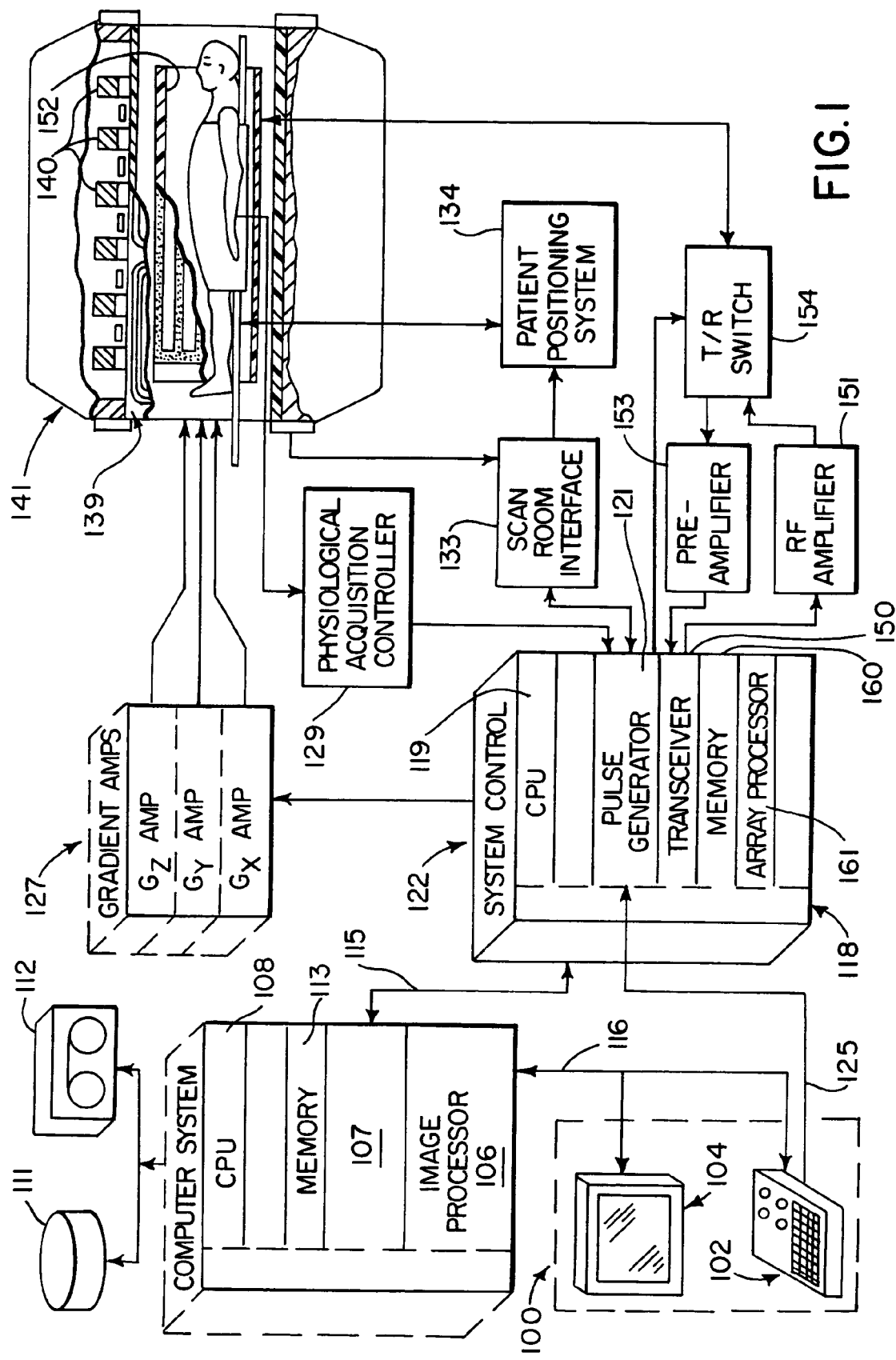
FIG. 1 is a block diagram of an MRI system which employs the present invention.
Figure 2:
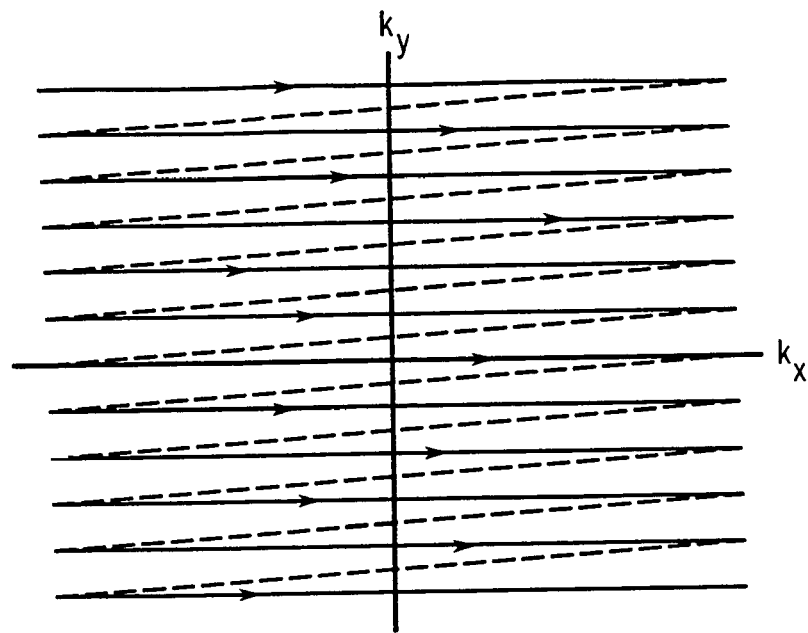
FIG. 2 is a schematic illustration of k-space sampling using a spin-warp pulse sequence to acquire image data with the MRI system of FIG. 1.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. As will be described in detail below, the ECG trigger signal is employed to synchronize the data acquisition sequence with the beating of the patient's heart. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data as will be described in more detail below. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

The preferred embodiment of the present invention is a method for operating the MRI system to acquire image data from which an image of the subject's myocardium can be produced. Prior to image acquisition the subject is injected with a contrast agent such as Gd-DTPA and a waiting period of 10 to 20 minutes occurs while the contrast agent is allowed to flow into the infarcted myocardium. A cardiac gated image acquisition sequence is then performed according to the teachings of the present invention.

Figure 5:
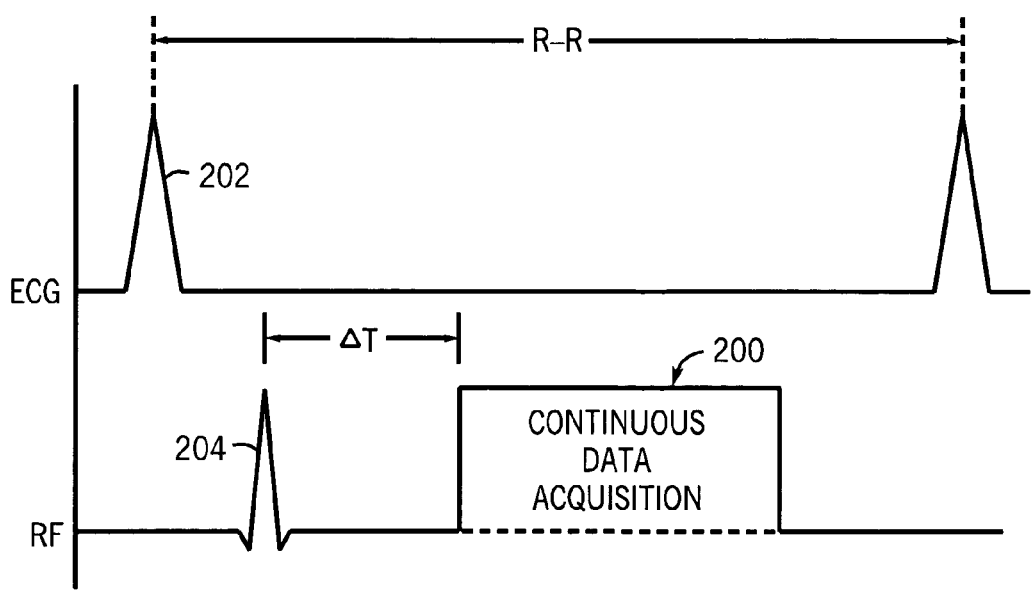
FIG. 5 is a graphic illustration of the cardiac gated acquisition of data according to a preferred embodiment of the invention.

Referring particularly to FIG. 5, image data is acquired continuously over a period indicated at 200 during the R-R interval of each cardiac cycle. Data is typically acquired over 16 successive cardiac cycles during a patient breathhold. The data acquisition during each cardiac cycle is initiated by an ECG trigger signal 202, and shortly thereafter, a 180° RF inversion pulse 204 is applied to invert the spin magnetization throughout the region of interest. After a delay period $\Delta T$ of 150 milliseconds, the acquisition period 200 during which MRI data is continuously acquired begins. Data is acquired for 200 milliseconds to ensure that data will be acquired at an optimal TI delay that may range anywhere from 150 milliseconds to over 250 milliseconds. Since the typical "prospective" TI setting is 200 milliseconds for nulling of normal myocardium signals, this wide range of data acquisition ensures that optimal data will be acquired during each cardiac cycle. Thus, instead of prospectively fixing the data acquisition period for a specific TI setting, data is acquired over a much larger time period.

Figure 3:
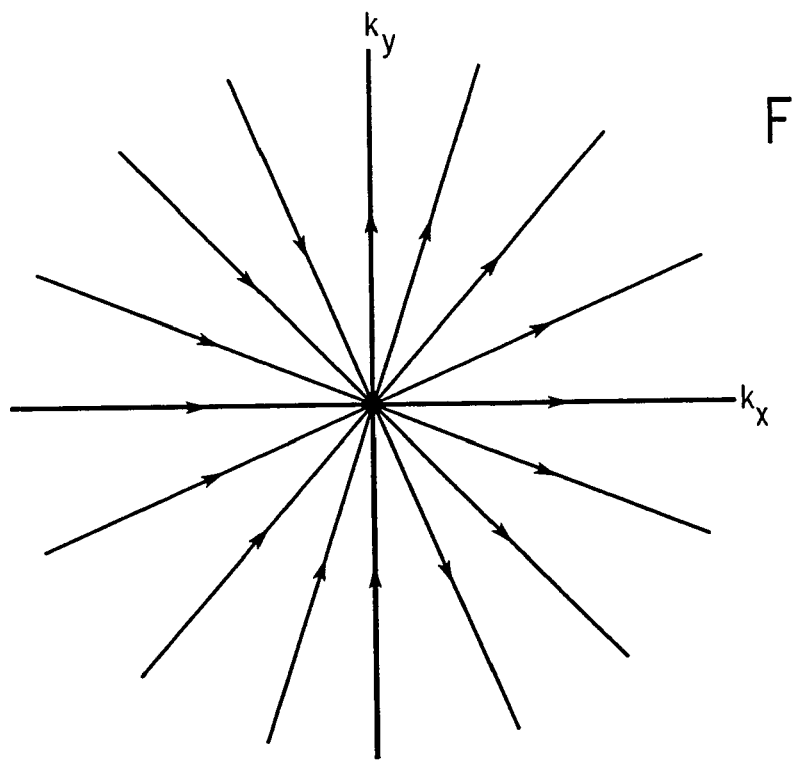
FIG. 3 is a schematic illustration of k-space sampling using a projection reconstruction pulse sequence to acquire image data.
Figure 4:
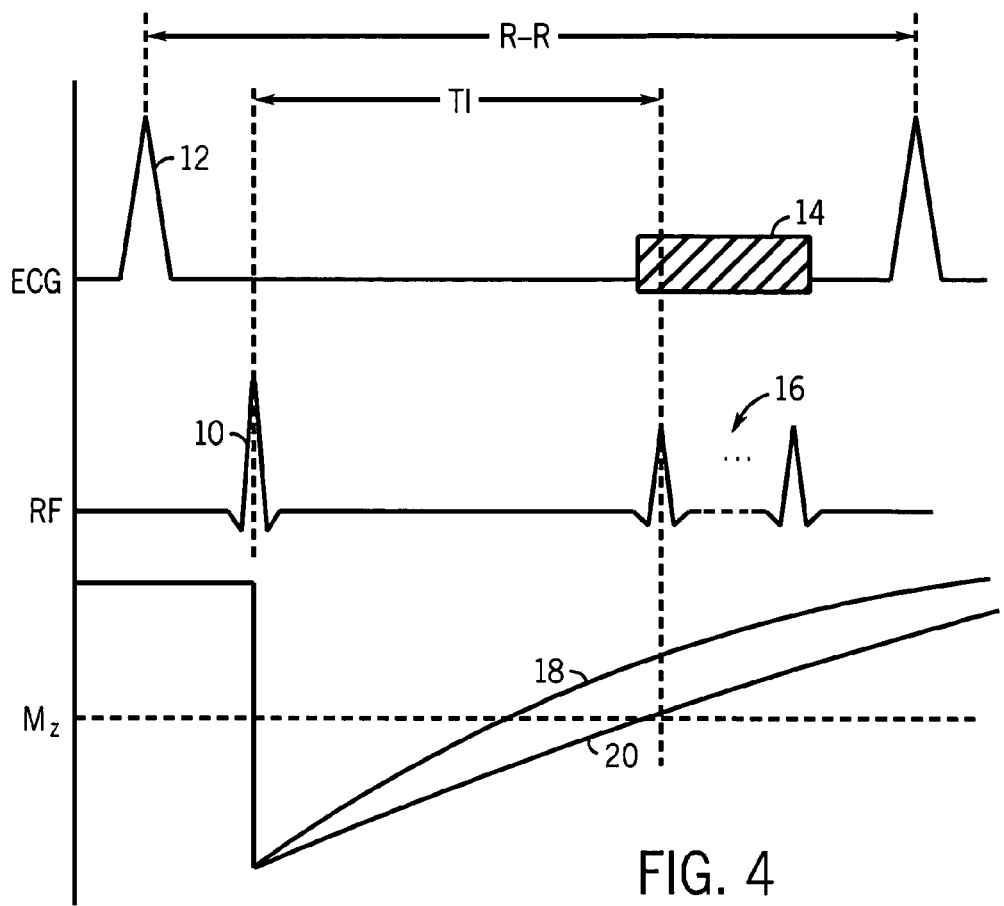
FIG. 4 is a graphic illustration of a cardiac gated, inversion recovery acquisition which requires prospective setting of a TI delay time in order to suppress the NMR signal from normal myocardium.

To allow data acquisition over a wide time span (e.g., 200 msec.) and still enable an image to be reconstructed which has a high temporal resolution (e.g., 20 msec.), the data acquisition is performed using a projection reconstruction ("PR") pulse sequence. As is well known in the art, each PR acquisition samples k-space along a trajectory that extends from the center of k-space and radially outward to the peripheral boundary of k-space as shown in FIG. 3. As a result, each PR acquisition includes data from both the periphery and the center of k-space. As is well known in the art, it is data from the center of k-space that determines the contrast, or brightness of larger objects such as the myocardium, whereas peripheral k-space data defines boundaries of small objects and sharpens edges on all objects. By acquiring a segment of eight, equally spaced radial projections as shown in FIG. 3, the 2D k-space is uniformly sampled in 20 milliseconds. A highly undersampled image may be reconstructed from this sparsely sampled k-space data set, and it will show the brightness of the myocardium during this short time interval. However, due to the undersampling (particularly in peripheral k-space) the image will contain streak artifacts.

The image produced by one, 8-projection segment acquired during a single cardiac cycle is substantially improved by acquiring fifteen additional segments during the same 20 msec. interval of subsequent cardiac cycles. The eight trajectories in each additional segment are rotated with respect to each other, such that the sampling trajectories of all 16 times 8 projections are interleaved to sample k-space as uniformly as possible. Peripheral k-space is thus sampled more thoroughly and streak artifacts are substantially reduced.

Figure 6:
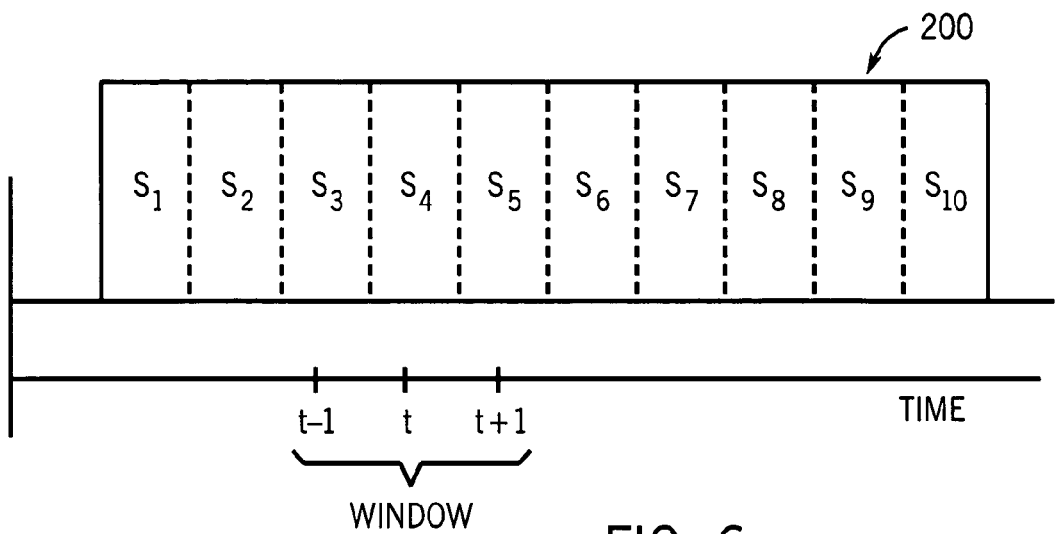
FIG. 6 is a graphic illustration of the data segments acquired during the data acquisition of FIG. 5 and a window of data therein that may be retrospectively selected and used to reconstruct an image.
Figure 7:
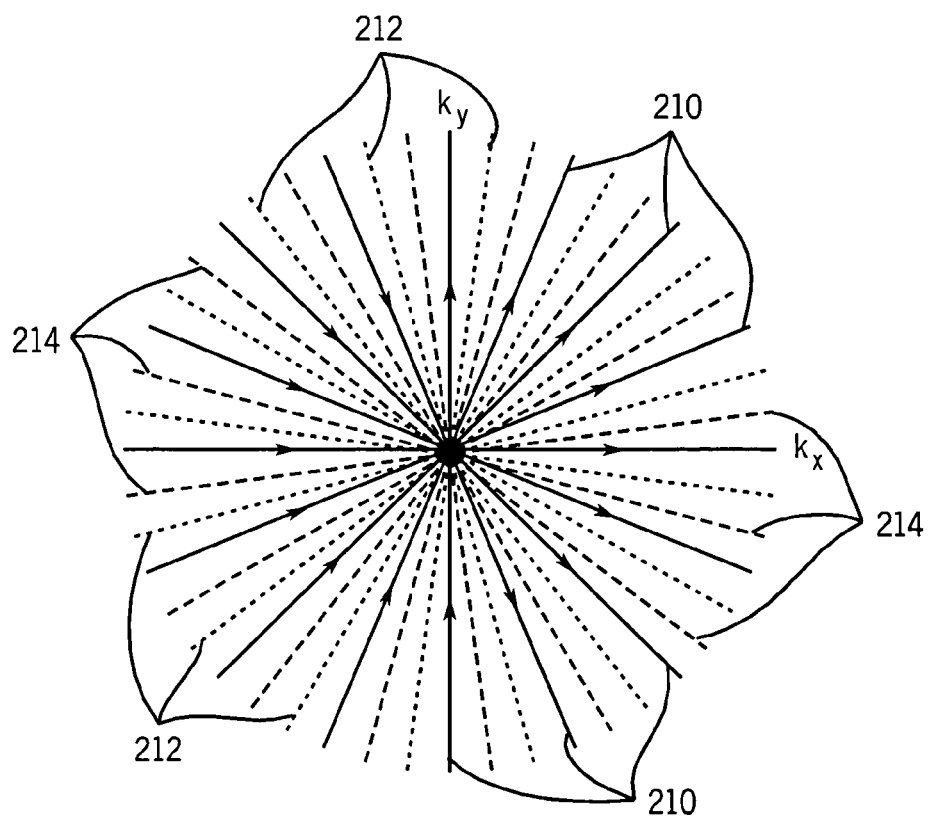
FIG. 7 is a graphic illustration of 2D k-space showing the sampling pattern of the data in the window of FIG. 6.

Referring particularly to FIG. 6, it is a further teaching of the present invention that image quality can be further improved by combining data acquired during other 20 msec. time segments. The 200 msec. acquisition period 200 during each cardiac cycle enables ten segments ($S_1$-$S_{10}$) of data to be acquired. As indicated above, eight projections are acquired during each segment $S_1$ through $S_{10}$ over a 20 msec. time interval. In addition, the projections in segments $S_1$ through $S_{10}$ are interleaved with each other such that none sample the same locations in k-space. As a result, a reconstructed image can be improved by combining data from successive segments $S_1$ through $S_{10}$ in addition to combining data from successive cardiac cycles as described above. For example, it may be determined retrospectively that normal myocardial signal is nulled best by an image reconstructed with data at delay time t from segment $S_4$. The k-space sampling of segment $S_4$ is indicated by solid lines 210 in FIG. 7. To improve image quality, data may also be used from adjacent segments $S_3$ and $S_5$ which are acquired at respective times t−1 and t+1. The k-space sampling of segment $S_3$ is indicated by dotted lines 212 and the k-space sampling of segment $S_5$ is indicated by dashed lines 214. By interleaving the projections acquired during successive segments $S_1$-$S_{10}$, therefore, data from more than one segment can be combined to further reduce k-space undersampling and improve image quality.

Figure 8:
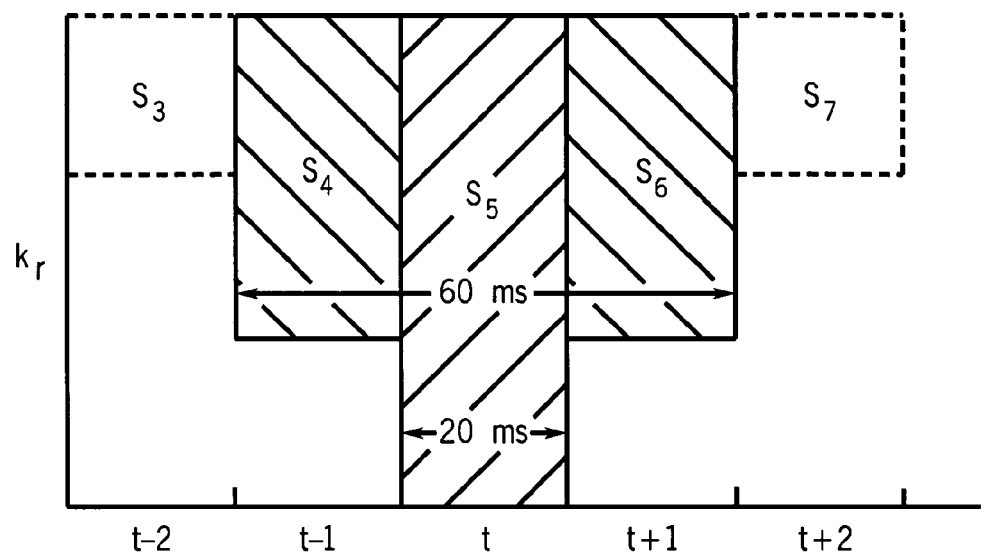
FIG. 8 is a graphic illustration of the k-space data combined and used to reconstruct an image according to one preferred embodiment.

Because k-space undersampling is inherently greater at the periphery of k-space with a projection acquisition, it is necessary to combine only peripheral k-space data from adjacent segments to substantially reduce streak artifacts. This is illustrated in FIG. 8, where the vertical axis indicates the distance $k_r$ of the acquired k-space data from the center of k-space and the horizontal axis indicates the time, or cardiac phase, of the acquired segment. In the above example, all of the k-space data in segment $S_4$ is used. This includes all of the central k-space data which determines the contrast of the myocardium acquired over the 20 msec. interval at time t. Combined with this data is peripheral k-space data from adjacent segments $S_3$ and $S_5$. In this example, the peripheral two-thirds of k-space sampled during segments $S_3$ and $S_5$ is combined to form a k-space data set which more fully samples the periphery of k-space. Note that the time resolution of the myocardium brightness level is substantially 20 milliseconds even though the time resolution of the image details is 60 milliseconds.

By acquiring interleaved projections over the entire sample period 200 of each cardiac cycle during the scan there is great flexibility in retrospectively determining delay period TI and reconstructing an optimal image. Referring first to FIGS. 5 and 6, an image may be reconstructed with a recovery time TI that ranges from 150 milliseconds to 250 milliseconds by sliding the window of data used to reconstruct the image from $t=S_1$ to $t=S_{10}$. Multiple images may thus be reconstructed at different recovery times TI to determine which best nulls the normal myocardial signal.

The size of the window used to form the combined k-space data set may also be changed retrospectively. When determining the optimal TI delay time, images may be reconstructed quickly using one segment $S_1$-$S_{10}$ at a time. When the optimal TI is determined from this step, then an image at that TI is reconstructed as described above using a data window of three segments. Referring particularly to FIG. 8, if streak artifacts are unacceptable when k-space data from three segments are combined, further k-space samples can be combined from temporally adjacent segments. In the example, peripheral k-space data from segments $S_3$ and $S_7$ may be combined to further reduce streak artifacts. To reduce the deleterious effect this may have on temporal resolution, only the outer one-third of k-space data is combined from segments $S_3$ and $S_7$.

Figure 9:
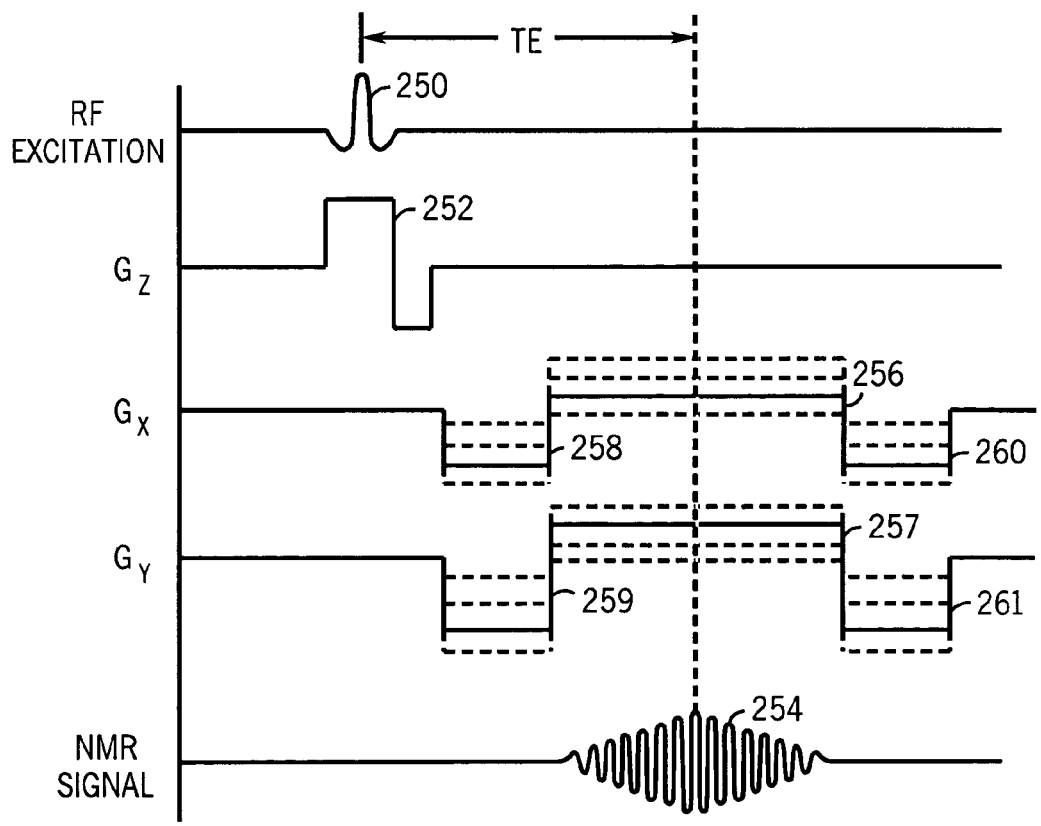
FIG. 9 is a graphic illustration of a preferred embodiment of a 2D projection reconstruction pulse sequence used in the MRI system of FIG. 1 to acquire the data in FIGS. 5 and 6.

Referring particularly to FIG. 9, the preferred pulse sequence performed by the pulse generator module 121 is a gradient-recalled echo pulse sequence in which an RF excitation pulse 250 is applied in the presence of a $G_z$ slice select gradient 252, and an NMR echo signal 254 is acquired in the presence of $G_x$ and $G_y$ readout gradients 256 and 257. Each readout gradient 256 and 257 is preceded by a dephasing gradient 258 and 259 respectively which dephases the transverse magnetization produced by RF excitation pulse 250 and is followed by a rephasing gradient 260 and 261, respectively. The readout gradients 256 and 257 rephase the spin magnetization at the echo time TE to produce the peak in the NMR echo signal 254.

There is no phase encoding gradient in this PR pulse sequence. Instead, the pulse sequence is repeated and the magnitudes of the two readout gradients 256 and 257 are stepped to different values during the above-described scan to acquire the NMR echo signal 254 at different projection angles. The amplitudes of the readout gradients 256 and 257 and the amplitudes of their corresponding dephasing gradient pulses 258 and 259 and a rephasing gradient pulses 260 and 261 are stepped through values such that each successive projection is rotated by an angle θ that is determined by the number of projections, interleaves, and segments. For example, if 128 equally-spaced projections with 3 sets of interleaves are acquired in 16 heart beats (segments), θ has to be incremented by 0.469 degrees from interleave-to-interleave during each cardiac cycle, by 1.406 degrees from segment-to-segment (cardiac cycle to cardiac cycle), and by 22.5 degrees from projection to projection within each segment.

Projections are acquired as fractional echoes and the projection angles range over 180°. Typical scan parameters are used:

TR=5.4 ms
TE=1.4 ms
Flip angle=20°
FOV=350 mm×350 mm
Slice thickness=5 to 10 mm
Receive bandwidth=±32 kHz.

It should be apparent that the sampling trajectories of this pulse sequence is a straight line that extends through the center of k-space. Other sampling trajectories are possible as long as the sampling trajectory passes through the center of k-space and extends substantially radially outward therefrom to also sample peripheral k-space.

After the scan is completed and a k-space data set is retrospectively formed by combining data as described above, either of two image reconstruction methods can be used to produce an image. A filtered back projection reconstruction method such as that disclosed in U.S. Pat. Nos. 4,620,153 or 4,625,171 may be employed. Each acquired NMR signal includes a set of k-space samples which extend along a line extending radially outward in both directions from the origin of k-space. Each NMR signal is fast Fourier transformed to form one projection view of the subject being imaged. Each such projection view may then be filtered and back projected using any of a number of well known methods such as that described by Herman, "Image Reconstruction From Projection", New York: Academic Press, 1980. The projection image is obtained by calculating the integrated density of substantially all planes which are normal to the plane of the projection image. This reconstruction procedure involves the classical reconstruction from projections widely used in x-ray computed tomography. The preferred method is a convolution-back projection.

It is also possible to reconstruct an image from the k-space samples by first regridding them into a two-dimensional rectilinear k-space data array as described, for example, in U.S. Pat. No. 5,557,203 entitled "Magnetic Resonance Imaging With Combined Back Projection and Fourier Transformation Method", which is hereby incorporated by reference. An image is reconstructed from the resulting 2D rectilinear k-space data array by performing a fast Fourier transformation along each of its axes.

While the preferred embodiment of this invention is a cardiac gated application, it can be appreciated that other non-gated clinical applications are also possible. Any application which requires the setting of a particular delay time after a magnetization preparation event has occurred may be improved. By acquiring a series of interleaved PR views after the event, one can retrospectively determine which one, or ones, were acquired at the optimal moment. These retrospectively selected projection views can be used to reconstruct the image.

It should also be apparent that a number of images depicting the myocardium at different times after the RF inversion pulse may be produced from the acquired data. While only one of these may show normal myocardium optimally suppressed, they will depict the heart at different cardiac phases. These anatomical images also have clinical value and can be used to assess wall motion abnormalities and they are acquired at no additional scan time.

We claim:

1. A method for producing an image of a subject with an MRI system, the steps comprising:
   a) performing a pulse sequence a plurality of times with the MRI system, the pulse sequence including:
      i) a magnetization preparation RF pulse;
      ii) a data acquisition portion, which occurs during a time period following the magnetization preparation RF pulse, in which k-space data is acquired by acquiring a series of projections that samples different radial trajectories in k-space, wherein during each repetition of the pulse sequence, a different series of projections is acquired that samples different radial trajectories in k-space;

b) retrospectively determining a delay time within the time period following the magnetization preparation RF pulse;

c) forming a k-space data set from k-space sample trajectories acquired in step a) at the delay time determined in step b); and d) reconstructing the image from the k-space data set formed in step c).

2. The method as recited in claim 1 in which steps b), c) and d) are repeated for a plurality of delay times and an optimal delay time is retrospectively determined by examination of the reconstructed images.

3. The method as recited in claim 2 in which step c) also includes combining k-space data from trajectories acquired by projection reconstruction pulse sequences performed near the optimal delay time.

4. The method as recited in claim 3 in which the k-space data acquired near the optimal delay time includes only peripheral k-space data.

5. The method as recited in claim 1 in which the subject is a human heart and the steps include producing a cardiac trigger signal which indicates a particular cardiac phase, and each performance of the pulse sequence is done at a selected time interval after the cardiac trigger signal.

6. A method for producing an image of myocardium in a beating heart of a subject with an MRI system, the steps comprising:

a) injecting a contrast agent into the subject;

b) producing a cardiac trigger signal indicative of the cardiac phase of the beating heart;

c) acquiring k-space data with the MRI system after production of the cardiac trigger signal by performing a pulse sequence that includes:

ci) an RF inversion pulse;

cii) a data acquisition portion, which occurs during a time period following the RF inversion pulse and before the next cardiac trigger signal, in which k-space data is acquired by acquiring a series of projections that sample a corresponding series of different k-space trajectories that each pass through the center of k-space and extend to the periphery of k-space;

d) repeating step c) after each of a plurality of subsequent cardiac trigger signals, wherein during each repetition the pulse sequence is altered to sample a corresponding series of k-space trajectories which are interleaved with the other series of sampled k-space trajectories;

e) selecting an inversion recovery delay time within the time period;

f) selecting k-space sample trajectories acquired in steps c) and d) at the inversion recovery delay time selected in step e); and g) reconstructing an image using the k-space sample trajectories selected in step f).

7. The method as recited in claim 6 in which the series of projections are divided into a plurality of segments, and each segment is comprised of a plurality of projections which sample a corresponding plurality of k-space trajectories that are substantially equally spaced around the origin of k-space and which are interleaved with the k-space trajectories of other segments.

8. The method as recited in claim 7 in which step f) includes selecting all the k-space sample trajectories in one of said segments.

9. The method as recited in claim 8 in which step f) also includes selecting peripheral k-space data from k-space sample trajectories in adjacent segments.

10. The method as recited in claim 6 in which steps e), f) and g) are repeated to produce a plurality of images, and an optimal inversion recovery delay time is determined by examination of said images.

\* \* \* \* \*